United States Patent [19]

Moulding

[11] Patent Number: 5,204,546
[45] Date of Patent: Apr. 20, 1993

[54] RATIOED CAPACITANCES IN INTEGRATED CIRCUITS

[75] Inventor: Kenneth W. Moulding, Horley, England

[73] Assignee: U.S. Philips Corp., New York, N.Y.

[21] Appl. No.: 717,731

[22] Filed: Jun. 19, 1991

[30] Foreign Application Priority Data

Jun. 20, 1990 [GB] United Kingdom ............... 9013741

[51] Int. Cl.$^5$ ...................... H01L 27/02; H01L 27/08
[52] U.S. Cl. .................................. 257/532; 361/303; 361/329
[58] Field of Search ................ 357/51, 23.6; 361/303, 361/306, 328, 329

[56] References Cited

U.S. PATENT DOCUMENTS

| | | | |
|---|---|---|---|
| 2,107,132 | 2/1938 | Smith | 361/329 |
| 4,210,950 | 7/1980 | Fraser, Jr. et al. | 361/329 |
| 4,342,143 | 8/1982 | Jennings | 361/330 |
| 4,654,749 | 3/1987 | Kanai | 361/321 |
| 4,695,922 | 9/1987 | Olmstead | 361/329 |
| 4,929,998 | 5/1990 | Boudewijns | 357/45 |
| 4,949,217 | 8/1990 | Ngo | 361/328 |

FOREIGN PATENT DOCUMENTS 466742 11/1951 Italy ...................................... 361/303

*Primary Examiner*—Jerome Jackson, Jr.
*Assistant Examiner*—D. Monin
*Attorney, Agent, or Firm*—Steven R. Biren

[57] ABSTRACT

In an integrated circuit in which the capacitances of a pair of capacitors are arranged to be in a ratio k by choosing the areas of corresponding plates of the two capacitors to be in this ratio, and the plates are shaped so that the total lengths of their boundaries are also in this ratio so as to reduce the sensitivity of k to manufacturing tolerances, this sensitivity is further reduced by arranging that the ratios between the numbers of 90° corners exhibited by the respective plates, and the numbers of 270° corners exhibited by the respective plates, are each also substantially equal to k. To make this possible an aperture is arranged to be present in each plate.

8 Claims, 2 Drawing Sheets

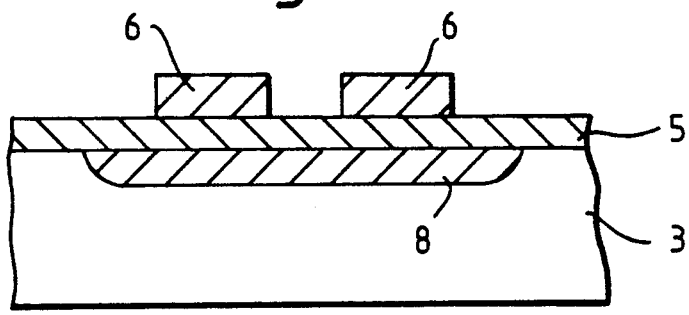
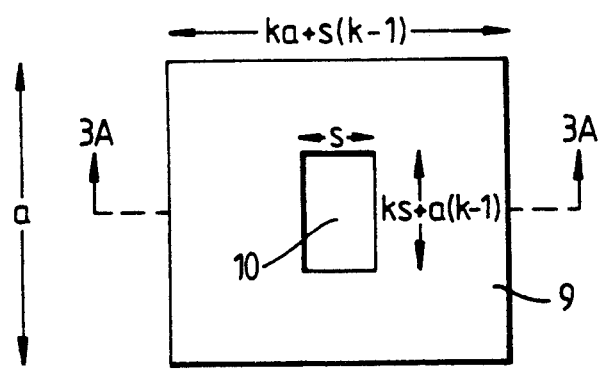
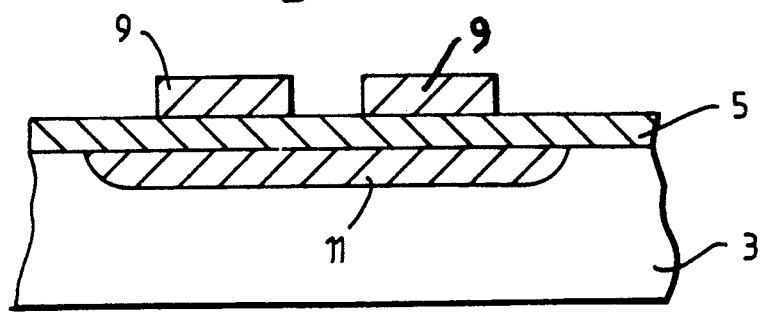

RATIOED CAPACITANCES IN INTEGRATED CIRCUITS

BACKGROUND OF THE INVENTION

This invention relates to an integrated circuit including first and second capacitors which each comprise a pair of continuous plates which are spaced apart by a layer of dielectric material which has the same composition and thickness for the two capacitors, the area of a first plate of the first capacitor being equal to k times the area of the corresponding plate of the second capacitor, thereby determining the capacitance of the first capacitor to be substantially k times the capacitance of the second capacitor, where k is greater than unity, the total length of the boundary of said first plate being k times the total length of the boundary of said corresponding plate.

Such an integrated circuit is known from U.S. Pat. No. 4,210,950. Fabrication of such a circuit typically involves a processing sequence that includes various etching or similar steps. The length of the boundary of the first plate of the first capacitor is arranged to be k times the total length of the boundary of the corresponding plate of the second capacitor in order to reduce the sensitivity of the ratio between the capacitances to variations which inevitably occur in the capacitor fabrication process from circuit to circuit. In the known circuit the said corresponding plate of the second capacitor is substantially H-shaped and the shape of the said first plate of the first capacitor is effectively a plurality of H-shapes with their long sides butted together. Thus the periphery of each includes a series of 90° and 270° corners, and it is pointed out in U.S. Pat. No. 4,210,950 that, ideally, both the ratio of the number of 90° corners in the first plate to the number of 90° corners in the corresponding plate, and the ratio of the number of 270° corners in the first plate to the number of 270° corners in the corresponding plate, should also be equal to k (in fact in the known circuit to the integer portion of k, k consisting of an integer portion plus a small fraction). This is for the same reason that the total lengths of the boundaries are chosen to be in the ratio k, corner rounding effects, which are generally different in the case of 90° corners and 270° corners, also occurring in the etching steps used to fabricate the capacitors. However these ratios are inherently impossible to achieve simultaneously with the purely H-shaped corresponding plate and the first plate shaped purely as abutting H-shapes of the known circuit, because the H-shaped plate contains different numbers of 90° and 270° corners (eight and four respectively), whereas abutting an H-shape adds an equal number (four) of 90° and 270° corners. It is an object of the invention to enable this problem to be overcome.

SUMMARY OF THE INVENTION

According to the invention an integrated circuit as defined in above is characterized that an aperture is present in both said first plate and said corresponding plate so that for both said first plate and said corresponding plate the total angle subtended externally by the concave portion(s) of the boundary thereof is equal to the total angle subtended internally by the convex portion(s) of the boundary thereof, and in that the forms of said boundaries are such that said total angles for said first plate are each substantially k times the corresponding said total angles for said corresponding plate.

It has now been recognized that the above-described difference between the number of 90° corners and the number of 270° corners in the H-shaped plate of the known circuit is a particular example of a more general property of the external or peripheral boundary of a plate of any shape, which is that if this external boundary is wholly convex, then it subtends internally a total angle of exactly 360°, whereas if it is partly convex and partly concave the convex portion(s) thereof subtend internally a total angle of more than 360° and the concave portion(s) thereof subtend externally a total angle which is exactly equal to the amount by which the total angle subtended internally by the convex portion(s) exceeds 360°. Thus, for example, the eight 90° (i.e. convex) corners of the known H-shaped plate subtend internally a total angle of $8 \times 90° = 360° + 360°$, whereas the four 270° (i.e. concave) corners thereof subtend externally a total angle of $4 \times 90° = 360°$. If an aperture is present within the plate, so that the plate boundary is now partly external and partly internal, the situation with respect to the total angles subtended externally and internally by the concave and any convex portions respectively of the internal part of the boundary is exactly the opposite to that subsisting in respect of the external portion of the boundary; the result is that the total angle subtended externally by the concave portion(s) of the complete boundary becomes equal to the total angle subtended internally by the convex portion(s) of the complete boundary. This in turn allows the said total angles for the said first plate to each be made substantially k times the corresponding said total angle for the said corresponding plate, if desired. For example, if a rectangular aperture is provided in both the H-shaped corresponding plate of U.S. Pat. No. 4,210,950 and in the first plate shaped purely as abutting H-shapes, each aperture will add four 270°-corners to the relevant plate, so that the said corresponding plate will now contain eight 90°-corners and eight 270°-corners whereas the said first plate will contain (8+4x) 90°-corners and (8+4x) 270°-corners, where x+1 is the number of abutting H-shapes. The said total angles are each therefore in the ratio (2+x):2.

The apertures need not, of course, be rectangular. If, for example, they are L-shaped, they will each add five 270°-corners and one 90°-corner, whereas if they are U-shaped with straight sides and base they will add six 270°-corners and two 90°-corners and so on. Although they are preferably shaped so that their boundaries (the internal portions of the boundaries of the corresponding plates) each consist of a succession of straight portions which meet each other at right angles, this also being the case for the external portions of the boundaries of the corresponding plates, this is not necessarily the case. A circular aperture, for example, will give rise to a internal boundary portion of the corresponding plate which is wholly concave and subtends externally a total angle of 360°; such an aperture effectively adds, at least to a first approximation, four 270°-corners to the corresponding plate, similarly to a square or rectangular aperture.

Providing the apertures will, in addition to subtracting from the areas of the relevant plates, add to the total lengths of the boundaries thereof by creating internal portions of the complete boundaries, and this will have to be taken into account when calculating the plate dimensions.

If the boundaries of said first plate and said corresponding plate each consist of a succession of straight portions which meet each other at right angles so that each said concave portion is in the form of a 270°-corner and each said convex portion is in the form of a 90°-corner, all said straight portions are preferably oriented so that they are either parallel to or at right angles to each of the other straight portions so that first and second sets thereof are formed with the members of each set parallel to each other and at right angles to the members of the other set. This allows plate configurations to be chosen such that those boundary portions of said first plate belonging to the first set have a total length which is k times the total length of those boundary portions of said corresponding plate belonging to the first set, and those boundary portions of said first plate belonging to the second set have a total length which is k times the total length of those boundary portions of said corresponding plate belonging to the second set. Adoption of such configurations reduces still further the sensitivity of the ratio between the capacitances of the first and second capacitors to variations in the capacitor fabrication process.

BRIEF DESCRIPTION OF THE DRAWING

Embodiments of the invention will now be described, by way of example, with reference to the accompanying diagrammatic drawing, in which:

FIG. 2A is a cross-sectional view, taken along the lines 2A of FIG. 2, of the part of said integrated circuit which includes the second capacitor, FIG. 3 is a plan view of a possible alternative to the first plate of FIG. 1, and FIG. 3A is a cross-sectional view, taken along the lines 3A of FIG. 3, of the part of the integrated circuit which includes the alternative of FIG. 3.

DESCRIPTION OF THE PREFERRED EMBODIMENTS

Figure 1:
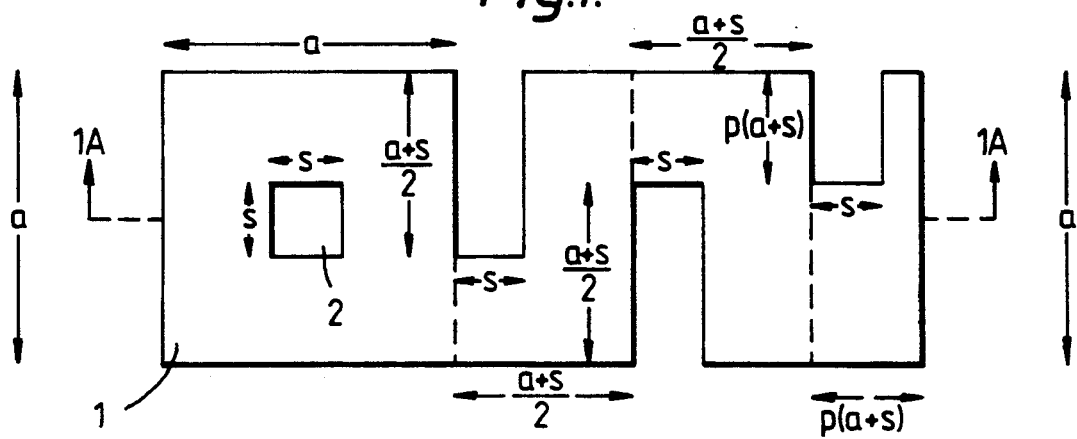
FIG. 1 is a plan view of a first plate of a first capacitor.

In FIG. 1 a first continuous plate 1 of a first capacitor included in an integrated circuit has a substantially rectangular external boundary of sides a and $a+(a+s)+p(a+s)$ respectively. A square aperture 2 of side s is present in the plate 1 and slots of width s are provided in the long sides of the rectangle, these being spaced along the length direction of the rectangle and alternating between the two long sides thereof. If one considers in succession the parts of the plate 1 which are shown separated by dashed lines it will be seen that its total area is:

$$a^2 - s^2 + a(a + s)/2 - s(a + s)/2 + a(a + s)/2 - s(a + s)/2 +$$

$$ap(a + s) - sp(a + s) = (a^2 - s^2) + (a^2 - s^2)/2 +$$

$$(a^2 - s^2)/2 + p(a^2 - s^2) = k(a^2 - s^2) \text{ where } k = 2 + p.$$

It will be evident that the total area of the plate 1 is in consequence k times the total area of a square plate of side a in which is present a square aperture of side s (similar to the left-hand part of the plate 1 in FIG. 1). The total length of the set of horizontal portions of the boundary of the plate 1 (including those defining the aperture 2) will be seen to be $2(2+p)(a+s)$, i.e. $2+p=k$ times the total length of the set of horizontal portions of the boundary of a similarly oriented square plate of side a in which is present a square aperture of side s. Similarly it will be seen that the total length of the set of vertical portions of the boundary of the plate 1 is $2(a+s)(2+p)$, i.e. again k times the total length of the set of vertical portions of the boundary of a similarly oriented square plate of side a in which is present a square aperture of side s (assuming the sides of the aperture are aligned with the sides of the plate). The plate 1 has ten 90°-corners and ten 270°-corners (including those adjoining the aperture 2) i.e. $(2+0.5)$ times the corresponding numbers of corners exhibited by a square plate of side a in which is present a square aperture of side s. Because, as will become evident below, p lies between 0.25 and 0.75, these ratios between the numbers of 90° and 270° corners in the two plates are substantially equal to k.

If either of the two center portions of the plate 1 shown separated by dashed lines were omitted (and the right-hand portion abutted the then remaining portions of the plate 1) it will be found that the relationships involving k pointed out above would still hold, but with k now equal to $1.5+p$. The numbers of 90° and 270° corners would both be reduced to eight so that the aforesaid ratios between the numbers of 270° and 90° corners would still be substantially equal to k. Similarly, if both these center portions were omitted (with the right-hand remaining portion now abutting the left-hand remaining portion) it will be found that again the relationships involving k would still hold but now with k equal to $1+p$. The numbers of 90° and 270° corners would both be reduced to six so that the aforesaid ratios between the numbers of 270° and 90° corners would still be substantially equal to k. In general the value of k can be incremented or decremented in units of one half by adding or removing respectively portions of the plate 1 identical to either of the two center portions shown (which are shown as mirror images of each other in the interests of symmetry, although this is not necessarily the case), without affecting the relationships involving k pointed out above and the correctness of the aforesaid ratios between the numbers of 90° and 270° corners. Thus, k can be given any value required (provided this is greater than 1.25) by a suitable choice of the number of center portions of the plate 1 provided and a suitable choice of the value of p between 0.25 and 0.75.

Figure 1A:
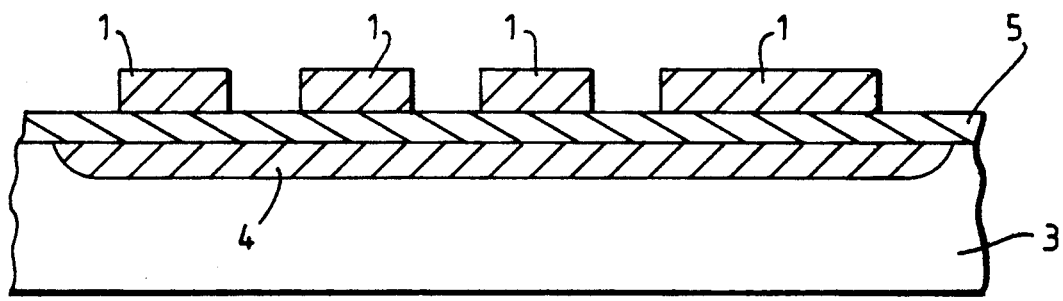
FIG. 1A is a cross-sectional view, taken along the lines 1A of FIG. 1, of part of an integrated circuit which includes the first capacitor.

FIG. 1A is a cross-section of the capacitor whose upper plate is shown in FIG. 1, taken along the line 1A—1A in FIG. 1. The capacitor is included in a monolithic integrated circuit the remainder of which is not shown and is formed on a semiconductor substrate 3 in the upper surface of which is provided an impurity diffusion 4 which has an area at least as large as the overall rectangular form of the plate 1. The diffusion 4 extends beneath the whole of the area of the plate 1, and preferably even beyond it, and thus forms the other plate of the capacitor. The capacitor dielectric is constituted by an insulating oxide layer 5, the metal plate 1 being deposited on this layer 5. (Of course this (MOS) construction is not the only one which may be employed; other possibilities are, for example, two metal electrodes separated by an insulating oxide layer or the replacement of the metal of at least one electrode by polysilicon).

Figure 2:
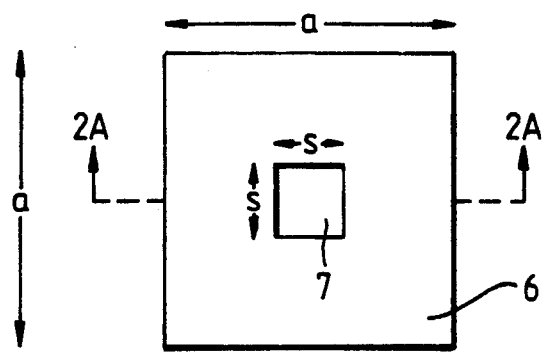
FIGS. 2 is a plan view of the corresponding plate of a second capacitor included in the integrated circuit.

Analogous to FIG. 1, FIG. 2 is a plan view of one continuous plate 6 of a second capacitor included in the same integrated circuit as the capacitor of FIGS. 1 and 1A. The plate 6 is in the form of a square of side a and a square aperture 7 of side s is present therein. Thus the electrode 6 is identical to the left-hand portion of the electrode 1 of FIG. 1 and in fact has the same orientation within the integrated circuit as has this portion. Thus the various comparisons made above between the plate 1 of FIG. 1 and a square plate of side a provided with a square aperture of side s apply with respect to the electrode 6 of FIG. 2.

Analogous to FIG. 1A, FIG. 2A is a cross-section of the capacitor whose upper plate is shown in FIG. 2, taken on the line 2A—2A in FIG. 2. An impurity diffusion 8 which has an area at least as large as the overall square form of the electrode 6 is provided in the upper surface of the substrate 3 during the same processing step as the diffusion 4 of FIG. 1A. The diffusion 8 extends beneath the whole of the area of the plate 6, and preferably even beyond it, and thus forms the other plate of the second capacitor. (In some circumstances the diffusions 8 and 4 could be amalgamated if it were required that one electrode of each capacitor were connected to one electrode of the other). The dielectric of the capacitor of FIGS. 2 and 2A is constituted by the insulating oxide layer 5, the dielectric material for the two capacitors thus having the same compositions and thicknesses as the whole of the layer 5 is formed during the same manufacturing step. The part of the layer 5 shown in FIG. 2A may or may not be contiguous with the part of the layer 5 shown in FIG. 1A depending, for example, on whether or not an intervening portion has been etched away. The metal plate 6 is deposited on the layer 5 during the same processing step as that during which the plate 1 of FIG. 1A is deposited. The comments made above concerning possible alternatives to the MOS construction for the capacitor of FIGS. 1 and 1A apply equally in respect of the capacitor of FIGS. 2 and 2A although, in general, the constructions employed for both capacitors should be similar to each other.

Because the diffusions 4 and 8 are at least as large as the electrodes 1 and 6 respectively the ratio between the capacitances of the capacitor of FIGS. 1 and 1A and the capacitor of FIGS. 2 and 2A is substantially equal to the ratio between the area of plate 1 and the area of plate 6, i.e. to the value k used above.

As mentioned above, k can be given any desired value greater than 1.25 by a suitable choice of the number of centre portions (if any) provided in the plate 6 of FIG. 1, together with a suitable choice of the value p. If a value of between unity and 1.25 is required for k the plate configuration shown in FIG. 1 may be replaced by that shown in FIG. 3.

Analogous to FIG. 1, FIG. 3 is a plan view of a first plate 9 of a first capacitor included in the aforesaid integrated circuit (which now at least also includes the capacitor described with reference to FIGS. 2 and 2A). The plate 9 is rectangular in overall form, of sides a and ka+s(k−1) respectively, and is provided with a rectangular aperture 10 of sides s and ks+a(k−1) respectively. Its area is therefore k(a²−s²), i.e. k times the area of the plate 6 of FIG. 2. The plate 9 is orientated in the integrated circuit relative to the plate 6 in the manner shown in the drawing. Thus the total length of the set of horizontal portions of the boundary of plate 9 (=2k(a+s)) is k times the total length of the set of horizontal portions of the boundary of plate 6. Also, the total length of the set of vertical portions of the boundary of plate 9 (again=2k(a+s)) is k times the total length of the set of vertical portions of the boundary of plate 6, as required. Both the plate 9 and the plate 6 have four 90°-corners and four 270°-corners, the (unity) ratio between the number of each type of corner in the two plates being thus substantially equal to k (which as has been already mentioned, lies between unity and 1.25 when the configuration of FIG. 3 is employed).

Analogous to FIG. 1A, FIG. 3A is a cross-section of the capacitor whose upper plate is shown in FIG. 3, taken along the line 3A—3A in FIG. 3. An impurity diffusion 11 which has an area at least as large as the overall rectangular form of the electrode 9 is provided in the upper surface of substrate 3 during the same processing step as the diffusion 8 of FIG. 2A. The diffusion 11 extends beneath the whole of the area of the plate 9 and preferably even beyond it, and therefore forms the other plate of the replacement for the capacitor of FIGS. 1 and 1A. (In some circumstances the diffusions 8 and 11 could be amalgamated if it were required that one electrode of each capacitor were connected to one electrode of the other). The dielectric of the capacitor of FIGS. 3 and 3A is constituted by the insulating oxide layer 5, the dielectric material for the two capacitors again therefore having the same compositions and thicknesses as the whole of the layer 5 is formed during the same manufacturing step (although the portions of the layer 5 shown in FIG. 2A and FIG. 3A may be physically separate from each other). The metal plate 9 is deposited on the layer 5 during the same manufacturing step as that during which the metal plate 6 of FIGS. 2 and 2A is deposited. The comments made above concerning possible alternatives to the MOS construction for the capacitor of FIGS. 1 and 1A apply equally in respect of the capacitor of FIGS. 3 and 3A although, in general, the construction employed for the capacitors of FIGS. 2 and 2A and FIGS. 3 and 3A should be similar to each other.

The particular configurations described for the upper plates of the two capacitors have the advantage that they are area-efficient; both have a rectangular form overall and the vertical (in the drawing) sides of each have the same length so that they can be positioned with one of these sides from each adjacent each other, with, therefore, a minimum waste of space between them. However it will be evident that many other configurations are possible within the scope of the invention as defined by the claims. For example, the boundaries of the plates do not necessarily have to be defined by a series of straight lines parallel to and at right angles to each other; the various "corners" may be simply rounded, and/or the various straight lines may be at other angles to each other. The various straight lines may even be replaced completely by curves. For example the configuration shown in FIG. 2 may be replaced by a circular electrode of radius $R_1$ within which is present a circular aperture of radius $R_2$, where $$R_1 = (1/\pi + \tfrac{1}{4})a + (1/\pi - \tfrac{1}{4})s$$

and $$R_2 = (1/\pi - \tfrac{1}{4})a + (1/\pi + \tfrac{1}{4})s.$$

Such an electrode will have the same area and total boundary length as the electrode shown in FIG. 2.

Moreover the convex portion of its boundary will again subtend internally a total area of 360°, and the concave portion of its boundary will again subtend externally a total area of 360°.

With the configuration described with reference to FIG. 1 the numbers of 90°-corners and 270°-corners is increased with increasing area (increasing number of portions similar to the two centre portions demarcated by dashed lines) by the resulting inclusion of more slots of width s and depth (a+s)/2 in the upper and lower edges of the overall rectangular plate, i.e. by adjusting the shape of the external portion of the plate boundary. (The number of slots is in fact 2(k'−1), where k' is k rounded up to the next higher multiple of 0.5). The numbers of corners may alternatively or additionally be adjusted by adjusting the shape of the internal portion of the plate boundary, i.e. the shape of the aperture 2. If this aperture were, for example, L-shaped instead of square it would contribute five 270°-corners and one 90°-corner, instead of four 270°-corners and no 90°-corners.

Although the invention has been described by way of an example in which the integrated circuit is of the monolithic type, it will be appreciated that this is not necessarily the case. It is also applicable when the integrated circuit takes another form, for example a so-called "thin film circuit".

From reading the present disclosure, other modifications will be apparent to persons skilled in the art. Such modifications may involve other features which are already known in the design, manufacture and use of integrated circuits and component parts thereof and which may be used instead of or in addition to features already described herein.

I claim:

1. An integrated circuit including a first capacitor and a second capacitor, the first capacitor comprising a first continuous plate, a second continuous plate and a first layer of dielectric material of a given composition and thickness for spacing apart the first and second plates, the first continuous plate having an area defined by a boundary, the second capacitor comprising a third continuous plate, a fourth continuous plate and a second layer of dielectric material having a composition and thickness equal to those of the first layer and spacing apart the third and fourth plates, the first continuous plate having an area k times greater than the area of the third plate defined by a boundary which is k times longer than the boundary of the third plate where k is greater than unity, wherein the first plate is provided with an aperture defining a portion of the boundary, and the boundary of that plate comprises convex portions subtending a summation of internal angles and concave portions subtending a summation of external angles which is equal to the summation of internal angles, the third plate is provided with an aperture defining a portion of the boundary, and the boundary of that plate comprises convex portions subtending a summation of internal angles and concave portions subtending a summation of external angles which is equal to the summation of internal angles, and wherein the summation of internal angles and the summation of external angles of the first plate are substantially k times the summation of internal angles and the summation of external angles of the third plate.

2. An integrated circuit as claimed in claim 1, wherein the boundary of the first plate and the boundary of the third plate each comprise a succession of straight lines and right-angled corners defined by the straight lines, each convex portion forming a 90° corner and each concave portion forming a 270° corner.

3. An integrated circuit as claimed in claim 2, wherein the straight lines which form the boundary of the first plate comprise a first set of parallel straight lines and a second set of parallel straight lines, the straight lines in the first set being perpendicular to the straight lines in the second set, and the straight lines which form the boundary of the third plate comprise a third set of parallel lines and a fourth set of parallel straight lines, the straight lines in the third set being parallel to straight lines in the first set and the straight lines in the fourth set being parallel to the straight lines in the second set, the straight lines in each the four sets each having a length, which lengths add to provide a total length of lines within the set, and wherein the total length of lines in the first set is k times the total length of lines in the third set and the total length of lines in the second set is k times the total length of lines in the fourth set.

4. An integrated circuit as claimed in claim 1, wherein the boundary of the third plate has an external portion which is substantially rectangular, and the boundary of the first plate has an external portion which is substantially rectangular overall.

5. An integrated circuit as claimed in claim 4, wherein the substantially rectangular overall external portion of the first plate has a first pair of parallel sides of a given length and a second pair of parallel sides perpendicular to the first pair of parallel sides and the substantially rectangular external portion of the third plate has a third pair of parallel sides of a given length and parallel to the first pair of parallel sides, and a fourth pair of parallel sides parallel to the second pair of parallel sides, the given length of the first pair of parallel sides being equal to the given length of the third pair of parallel sides.

6. An integrated circuit as claimed in claim 5, wherein the third plate is square.

7. An integrated circuit as claimed in claim 4, wherein the substantially rectangular overall external portion of the first plate has a first pair of parallel sides and a second pair of parallel sides perpendicular to the first pair of parallel sides, the second pair of parallel sides comprising a longer pair of sides than the first pair of parallel sides, and a number of slots equal to 2(k'−1) are present in the second pair of parallel sides, where k' is the half integer value closest to k.

8. An integrated circuit as claimed in claim 7, wherein the slots are spaced along the second pair of parallel sides and are arranged alternately in the two sides making up the second pair.

* * * * *